US010908022B2

(12) United States Patent
Kasahara et al.

(10) Patent No.: US 10,908,022 B2
(45) Date of Patent: *Feb. 2, 2021

(54) PRODUCTION METHOD FOR FABRY-PEROT INTERFERENCE FILTER

(71) Applicant: HAMAMATSU PHOTONICS K.K., Hamamatsu (JP)

(72) Inventors: Takashi Kasahara, Hamamatsu (JP); Katsumi Shibayama, Hamamatsu (JP); Masaki Hirose, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/065,856

(22) PCT Filed: May 1, 2017

(86) PCT No.: PCT/JP2017/017167
§ 371 (c)(1),
(2) Date: Jun. 25, 2018

(87) PCT Pub. No.: WO2017/203947
PCT Pub. Date: Nov. 30, 2017

(65) Prior Publication Data
US 2018/0373021 A1      Dec. 27, 2018

(30) Foreign Application Priority Data
May 27, 2016   (JP) .................................. 2016-106269
Aug. 24, 2016  (JP) .................................. 2016-163928

(51) Int. Cl.
*G01J 3/26*      (2006.01)
*B23K 26/53*    (2014.01)
(Continued)

(52) U.S. Cl.
CPC ............ *G01J 3/26* (2013.01); *B23K 26/0006* (2013.01); *B23K 26/064* (2015.10);
(Continued)

(58) Field of Classification Search
CPC .... G02B 26/00; G02B 5/28; G01J 3/26; G01J 3/02; G01J 3/0243; B81C 1/00;
(Continued)

(56) References Cited

U.S. PATENT DOCUMENTS 6,436,794 B1 *  8/2002  Lee .................... B81C 1/00896
                                                              257/E21.705
7,063,466 B2    6/2006  Ferguson
(Continued)

FOREIGN PATENT DOCUMENTS

CN       1059968 A     4/1992
CN       1085343 C     5/2002
(Continued)

OTHER PUBLICATIONS

International Preliminary Report on Patentability (IPRP) dated Mar. 7, 2019 that issued in WO Patent Application No. PCT/JP2017/024645.
(Continued)

*Primary Examiner* — Dana Ross
*Assistant Examiner* — Ket D Dang
(74) *Attorney, Agent, or Firm* — Faegre Drinker Biddle & Reath LLP

(57) ABSTRACT

A method of manufacturing a Fabry-Perot interference filter includes a forming step of forming a first thinned region, a first mirror layer, a sacrificial layer, and a second mirror
(Continued)

layer are formed on a first main surface of a wafer, and the first thinned region in which at least one of the first mirror layer, the sacrificial layer, and the second mirror layer is partially thinned along each of a plurality of lines is formed; a cutting step of cutting the wafer into a plurality of substrates along each of the plurality of lines by forming a modified region within the wafer along each of the plurality of lines through irradiation of a laser light, after the forming step; and a removing step of removing a portion from the sacrificial layer through etching, between the forming step and the cutting step or after the cutting step.

9 Claims, 9 Drawing Sheets

(51) Int. Cl.
| | |
|---|---|
| B23K 26/00 | (2014.01) |
| B23K 26/064 | (2014.01) |
| B81B 3/00 | (2006.01) |
| B81C 1/00 | (2006.01) |
| G01J 3/02 | (2006.01) |
| G02B 5/28 | (2006.01) |
| G02B 26/00 | (2006.01) |
| B23K 103/00 | (2006.01) |
| B23K 101/40 | (2006.01) |
| B23K 26/06 | (2014.01) |

(52) U.S. Cl.
CPC .......... *B23K 26/0643* (2013.01); *B23K 26/53* (2015.10); *B81B 3/0072* (2013.01); *B81C 1/00539* (2013.01); *B81C 1/00634* (2013.01); *G01J 3/0243* (2013.01); *G02B 5/284* (2013.01); *G02B 26/001* (2013.01); *B23K 2101/40* (2018.08); *B23K 2103/56* (2018.08)

(58) Field of Classification Search
CPC ... B81C 1/00539; B81C 1/00634; B81B 3/00; B81B 3/0072; B23K 26/06; B23K 2101/40; B23K 2103/56; B23K 26/0006; B23K 26/064; B23K 26/0643; B23K 26/53
USPC .............................. 219/121.6–121.86, 121.72
See application file for complete search history.

(56) References Cited

U.S. PATENT DOCUMENTS

| | | | |
|---|---|---|---|
| 7,420,728 B2 | 9/2008 | Tung et al. | |
| 7,830,586 B2 | 11/2010 | Miles | |
| 9,261,753 B2 | 2/2016 | Guo et al. | |
| 2003/0002809 A1 | 1/2003 | Jian | |
| 2003/0116711 A1 | 6/2003 | Hara et al. | |
| 2006/0110851 A1* | 5/2006 | Burrell | H01L 21/52 438/108 |
| 2007/0041076 A1 | 2/2007 | Zhong et al. | |
| 2007/0057999 A1 | 3/2007 | Kuroda | |
| 2007/0202628 A1 | 8/2007 | Wuertz | |
| 2009/0109423 A1 | 4/2009 | Carr | |
| 2010/0015782 A1* | 1/2010 | Yu | H01L 21/78 438/463 |
| 2011/0279824 A1 | 11/2011 | Blomberg et al. | |
| 2012/0287138 A1 | 11/2012 | Zhong et al. | |
| 2013/0059428 A1* | 3/2013 | Arai | H01L 21/78 438/462 |
| 2013/0329232 A1 | 12/2013 | Antila et al. | |
| 2014/0099777 A1 | 4/2014 | Mackh et al. | |
| 2014/0111811 A1 | 4/2014 | Tuohiniemi | |
| 2015/0138642 A1 | 5/2015 | Banerjee et al. | |
| 2015/0311664 A1 | 10/2015 | Bulovic et al. | |
| 2016/0370573 A1 | 12/2016 | Shibayama et al. | |
| 2020/0141801 A1* | 5/2020 | Kasahara | B81C 1/00 |

FOREIGN PATENT DOCUMENTS

| | | |
|---|---|---|
| CN | 1758986 A | 4/2006 |
| CN | 1849699 A | 10/2006 |
| CN | 1983557 A | 6/2007 |
| CN | 102375229 A | 3/2012 |
| CN | 103026468 A | 4/2013 |
| CN | 102449447 B | 6/2014 |
| CN | 105339829 A | 2/2016 |
| EP | 3 018 521 A1 | 5/2016 |
| EP | 3 467 567 A1 | 4/2019 |
| EP | 3 505 987 A1 | 7/2019 |
| EP | 3 505 988 A1 | 7/2019 |
| JP | 2007-36233 A | 2/2007 |
| JP | 2007-77864 A | 3/2007 |
| JP | 2008-103776 A | 5/2008 |
| JP | 2009-505162 A | 2/2009 |
| JP | 2009-81428 A | 4/2009 |
| JP | 2009-147108 A | 7/2009 |
| JP | 2011-27923 A | 2/2011 |
| JP | 2011-87272 A | 4/2011 |
| JP | 2011-181909 A | 9/2011 |
| JP | 2012-528345 A | 11/2012 |
| JP | 2013-506154 A | 2/2013 |
| JP | 2013-257561 | 12/2013 |
| JP | 2015-11311 A | 1/2015 |
| JP | 2015-011312 A | 1/2015 |
| JP | 2015-521401 A | 7/2015 |
| JP | 2015-152713 A | 8/2015 |
| JP | 2015-199071 A | 11/2015 |
| JP | 2016-99583 A | 5/2016 |
| WO | WO-2007/022476 A1 | 2/2007 |
| WO | WO 2007/107176 A1 | 9/2007 |
| WO | WO-2010/075012 A2 | 7/2010 |
| WO | WO-2010/086502 A1 | 8/2010 |
| WO | WO 2010/136654 A1 | 12/2010 |
| WO | WO-2011/036346 A1 | 3/2011 |
| WO | WO-2013/158995 A1 | 10/2013 |
| WO | WO 2015/002028 | 1/2015 |
| WO | WO-2015/122316 A1 | 8/2015 |
| WO | WO-2015/195123 A1 | 12/2015 |

OTHER PUBLICATIONS

International Preliminary Report on Patentability (IPRP) dated Dec. 6, 2018 that issued in WO Patent Application No. PCT/JP2017/017172.
International Preliminary Report on Patentability (IPRP) dated Dec. 6, 2018 that issued in WO Patent Application No. PCT/JP2017/017167.
International Preliminary Report on Patentability (IPRP) dated Dec. 6, 2018 that issued in WO Patent Application No. PCT/JP2017/019680.
A. Rissanen et al., "Tunable MOEMS Fabry-Perot interferometer for miniaturized spectral sensing in near-infrared", Proceedings of SPIE/ IS & T, vol. 8977, Mar. 7, 2014, p. 89770X, XP060034717.
S. Sullivan et al., "Non-Traditional Dicing of MEMS Devices", NSTI-Nanotech 2008, Jan. 1, 2008, XP055144278.
A. Hooper et al., "Review of wafer dicing techniques for via-middle process 3DI/TSV ultrathin silicon device wafers", 2015 IEEE 65th Electronic Components and Technology Conference (ECTC), IEEE, May 26, 2015, p. 1436-p. 1446, XP033175240.
Notification of First Office Action dated Sep. 1, 2020 in Chinese Patent Application No. 201780041828.3 (6 pages) with an English translation (3 pages).

* cited by examiner (a)

(b)

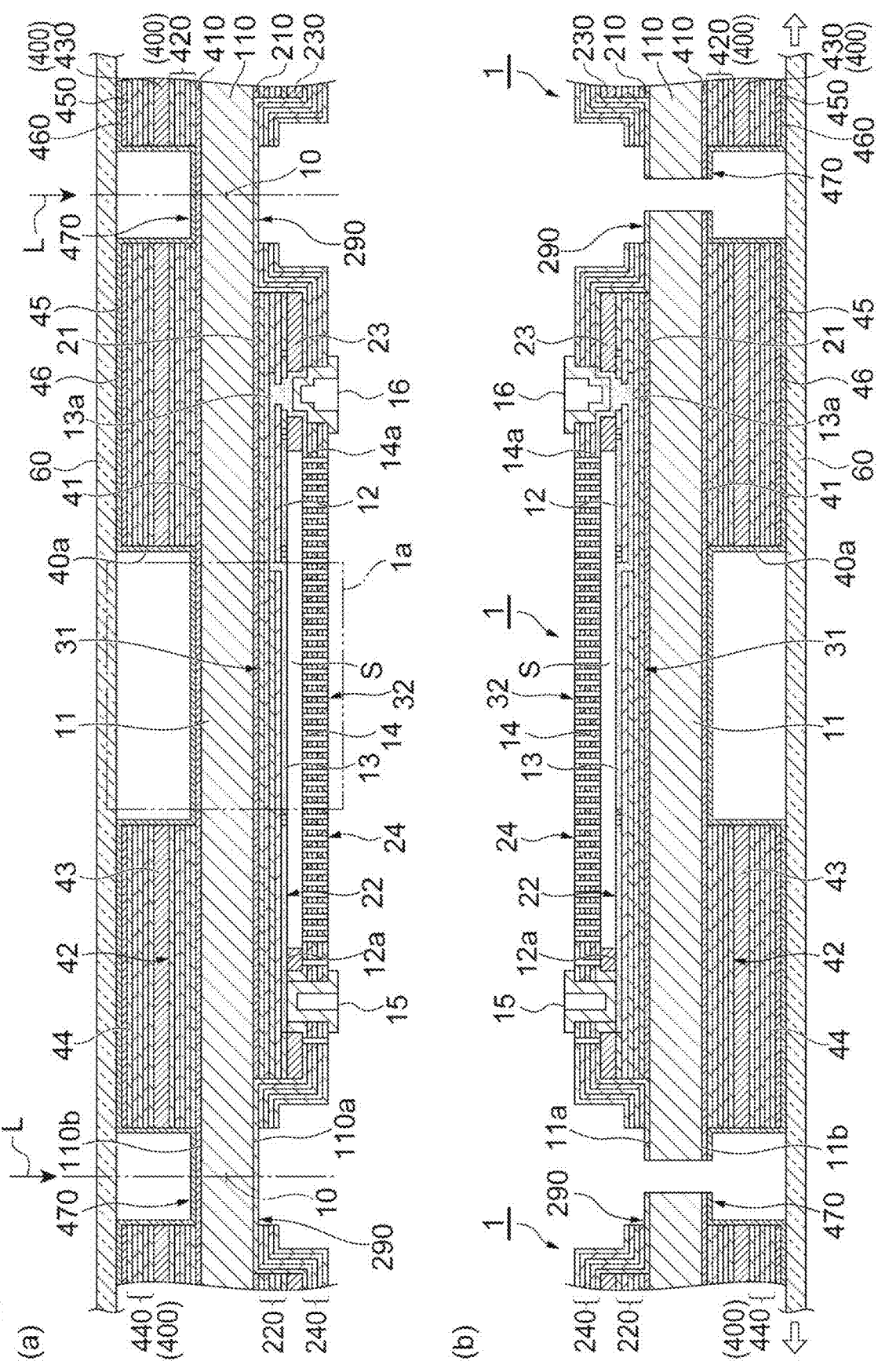

PRODUCTION METHOD FOR FABRY-PEROT INTERFERENCE FILTER

TECHNICAL FIELD

The present disclosure relates to a method of manufacturing a Fabry-Perot interference filter.

BACKGROUND ART

In the related art, a Fabry-Perot interference filter, which includes a substrate, a fixed mirror and a movable mirror facing each other with a gap interposed therebetween on the substrate, and an intermediate layer defining the gap, is known (for example, refer to Patent Literature 1).

CITATION LIST

Patent Literature

Patent Literature 1: Japanese Unexamined Patent Publication No. 2013-506154

SUMMARY OF INVENTION

Technical Problem

Since a Fabry-Perot interference filter as described above is a fine structure, it is difficult to improve both manufacturing efficiency and a yield when a Fabry-Perot interference filter is manufactured.

Accordingly, an object of the present disclosure is to provide a method of manufacturing a Fabry-Perot interference filter, in which both manufacturing efficiency and a yield can be improved.

Solution to Problem

According to an aspect of the present disclosure, there is provided a method of manufacturing a Fabry-Perot interference filter including a forming step of forming a first thinned region in the forming step, a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror are formed on a first main surface of a wafer expected to be cut into a plurality of substrates along each of a plurality of lines such that one first mirror portion, one portion expected to be removed, and one second mirror portion are disposed in this order from one substrate side, and the first thinned region in which at least one of the first mirror layer, the sacrificial layer, and the second mirror layer is partially thinned along each of the plurality of lines is formed; a cutting step of cutting the wafer into the plurality of substrates along each of the plurality of lines by forming a modified region within the wafer along each of the plurality of lines through irradiation of a laser light and extending a crack in a thickness direction of the wafer from the modified region, after the forming step; and a removing step of removing the portion expected to be removed from the sacrificial layer through etching, between the forming step and the cutting step or after the cutting step.

In the method of manufacturing a Fabry-Perot interference filter, after forming the first thinned region in which at least one of the first mirror layer, the sacrificial layer, and the second mirror layer is partially thinned along each of the lines, the modified region is formed within the wafer along each of the lines through irradiation of a laser light. Accordingly, scattering or the like of a laser light is prevented so that the modified region can be reliably formed within the wafer. Moreover, since at least one of the first mirror layer, the sacrificial layer, and the second mirror layer is partially thinned along each of the lines, it is possible to prevent damage from being caused in the first mirror layer, the sacrificial layer, and the second mirror layer when a wafer is cut into a plurality of substrates along each of the lines. Thus, according to the method of manufacturing a Fabry-Perot interference filter, both manufacturing efficiency and a yield can be improved. The "first thinned region" includes a region from which all of the parts along each of the lines in the first mirror layer, the sacrificial layer, and the second mirror layer are removed.

According to the aspect of the present disclosure, in the method of manufacturing a Fabry-Perot interference filter, in the forming step, a stress adjustment layer may be formed on a second main surface of the wafer, and a second thinned region in which the stress adjustment layer is partially thinned along each of the plurality of lines may be formed. According to this configuration, it is possible to prevent warping of the wafer caused by discordance of a layer configuration between the first main surface side and the second main surface side. Moreover, since the stress adjustment layer is partially thinned along each of the lines, it is possible to prevent damage from being caused in the stress adjustment layer when a wafer is cut into a plurality of substrates along each of the lines. The "second thinned region" includes a region from which all of the parts along each of the lines in the stress adjustment layer are removed.

According to the aspect of the present disclosure, in the method of manufacturing a Fabry-Perot interference filter, in the cutting step, the crack may be extended in the thickness direction of the wafer from the modified region by expanding an expanding tape attached to the stress adjustment layer side. According to this configuration, it is possible to prevent damage from being caused due to the attached expanding tape in the second mirror layer having the plurality of second mirror portions each of which is expected to function as the movable mirror. Moreover, since an expanding force of the expanding tape is likely to be concentrated in the modified region and a part in the vicinity thereof due to the presence of the second thinned region, the crack can be easily extended in the thickness direction of the wafer from the modified region.

According to the aspect of the present disclosure, in the method of manufacturing a Fabry-Perot interference filter, in the cutting step, in a state in which the expanding tape is attached to the stress adjustment layer side, the laser light may be incident on the wafer from a side opposite to the expanding tape. According to this configuration, scattering, attenuation, or the like of a laser light caused by the expanding tape is prevented so that the modified region can be reliably formed within the wafer along each of the lines.

According to the aspect of the present disclosure, in the method of manufacturing a Fabry-Perot interference filter, in the cutting step, in a state in which the expanding tape is attached to the stress adjustment layer side, the laser light may be incident on the wafer through the expanding tape from the expanding tape side. According to this configuration, for example, even if particles fall due to their own weight when irradiation of a laser light is performed from above, the expanding tape functions as a cover. Therefore, it is possible to prevent such particles from adhering to the second mirror layer or the like.

According to the aspect of the present disclosure, in the method of manufacturing a Fabry-Perot interference filter, the removing step may be carried out between the forming step and the cutting step. According to this configuration, since the removing step of removing the portion expected to be removed from the sacrificial layer through etching is carried out at wafer level, compared to a case in which the removing step is individually carried out at chip level, it is possible to form a gap between the first mirror portion and the second mirror portion in a remarkably efficient way. At this time, although parts respectively corresponding to the plurality of second mirror portions in the second mirror layer are in a state of floating in the gap, the following cutting step is carried out through irradiation of a laser light. Therefore, it is possible to effectively prevent a situation in which the second mirror portions floating in the gap become damaged.

According to the aspect of the present disclosure, in the method of manufacturing a Fabry-Perot interference filter, in the forming step, after a part along each of the plurality of lines in the sacrificial layer formed on the first mirror layer is thinned, side surfaces of the sacrificial layer facing each other along each of the plurality of lines may be covered with the second mirror layer by forming the second mirror layer on the sacrificial layer. According to this configuration, it is possible to prevent a part of the side surfaces of the sacrificial layer from being removed when the portion expected to be removed is removed from the sacrificial layer through etching. Moreover, in a manufactured Fabry-Perot interference filter, it is possible to prevent light which becomes stray light from being incident from the side surface of an intermediate layer corresponding to the side surface of the sacrificial layer.

According to the aspect of the present disclosure, in the method of manufacturing a Fabry-Perot interference filter, in the forming step, a part along each of the plurality of lines in at least one of the first mirror layer, the sacrificial layer, and the second mirror layer may be thinned such that a surface of at least one layer configuring the first mirror layer or the second mirror layer is exposed. In the cutting step, the laser light may be incident on the wafer through the surface of the layer. According to this configuration, the first main surface of the wafer is protected by at least one layer configuring the first mirror layer or the second mirror layer, and flatness of a surface, on which a laser light is incident, is maintained. Therefore, scattering or the like of a laser light is prevented so that the modified region can be more reliably formed within the wafer.

Advantageous Effects of Invention

According to the present disclosure, it is possible to provide a method of manufacturing a Fabry-Perot interference filter, in which both manufacturing efficiency and a yield can be improved.

BRIEF DESCRIPTION OF DRAWINGS

FIGS. 9(a) and 9(b) are cross-sectional views for describing the method of manufacturing the Fabry-Perot interference filter in FIG. 1.

DESCRIPTION OF EMBODIMENT

Figure 1:
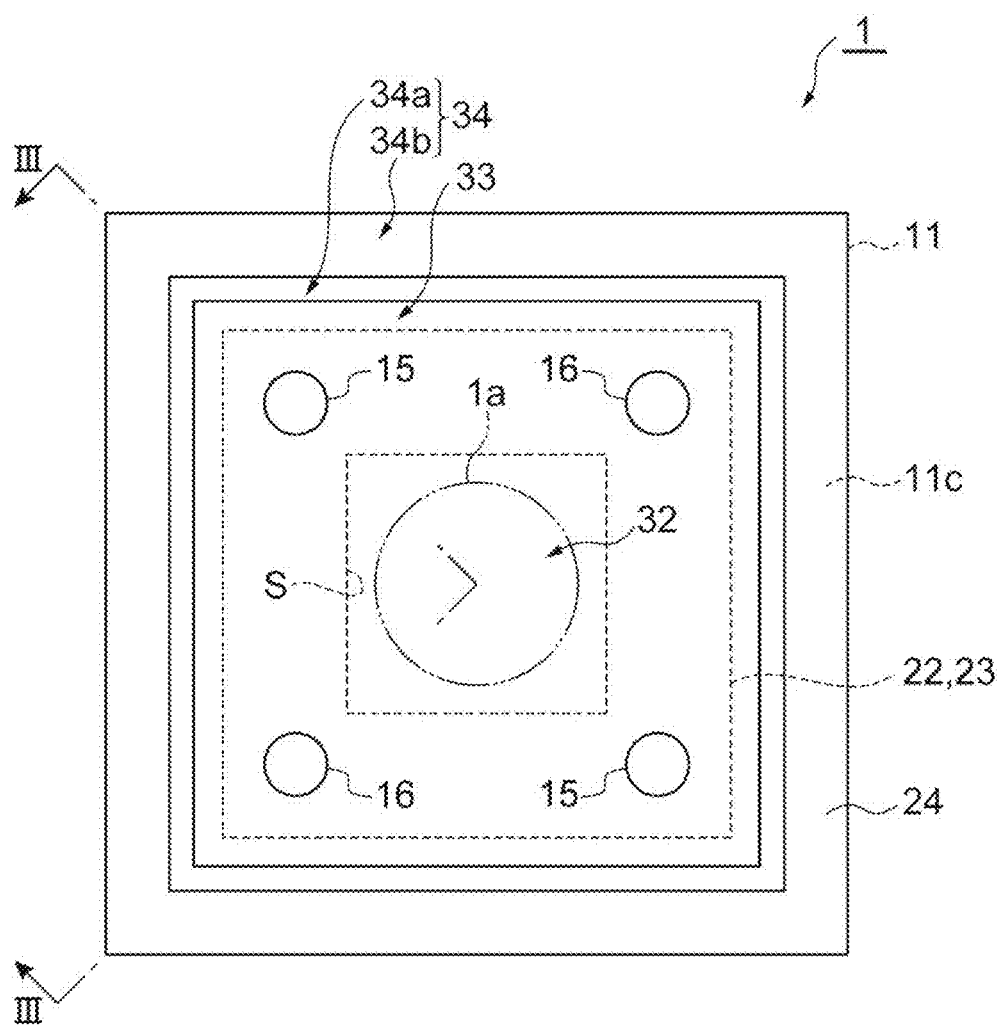
FIG. 1 is a plan view of a Fabry-Perot interference filter of an embodiment.

Hereinafter, an embodiment of the present disclosure will be described in detail with reference to the drawings. In all the drawings, the same or equivalent portions are denoted with the same reference numerals and duplicated description is omitted.

Configuration of Fabry-Perot Interference Filter

Figure 2:
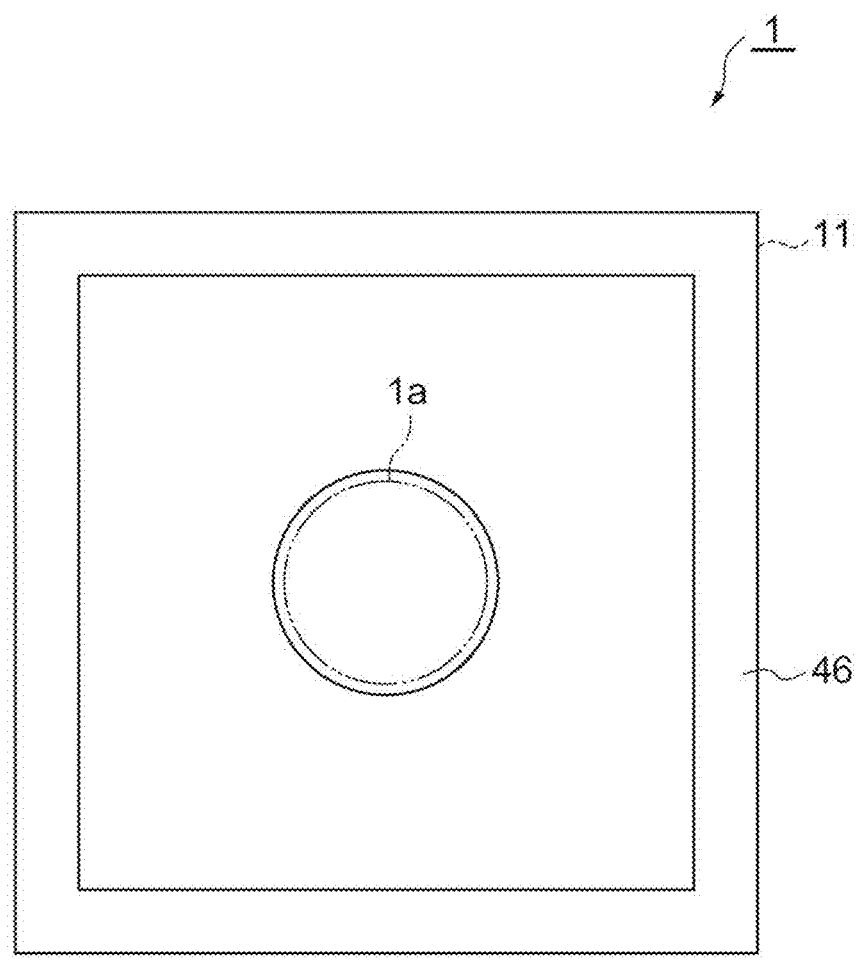
FIG. 2 is a bottom view of the Fabry-Perot interference filter in FIG. 1.
Figure 3:
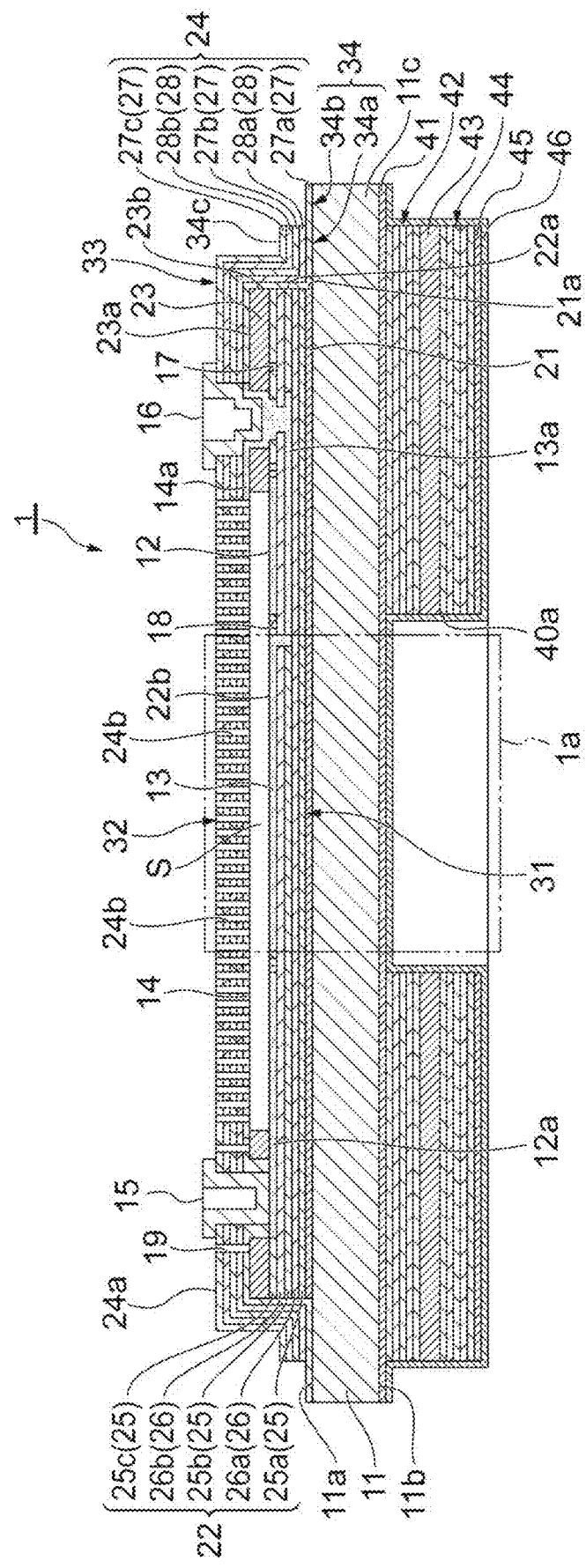
FIG. 3 is a cross-sectional view of the Fabry-Perot interference filter taken along line in FIG. 1.

As illustrated in FIGS. 1, 2, and 3, a Fabry-Perot interference filter 1 includes a substrate 11. The substrate 11 has a first surface 11a and a second surface 11b facing the first surface 11a. On the first surface 11a, a reflection prevention layer 21, a first laminate (first layer) 22, an intermediate layer 23, and a second laminate (second layer) 24 are laminated in this order. A gap (air gap) S is defined between the first laminate 22 and the second laminate 24 by the frame-shaped intermediate layer 23.

The shape and the positional relationship of each portion in a case of being seen in a direction perpendicular to the first surface 11a (plan view) are as follows. For example, an outer edge of the substrate 11 has a rectangular shape. The outer edge of the substrate 11 and an outer edge of the second laminate 24 coincide with each other. An outer edge of the reflection prevention layer 21, an outer edge of the first laminate 22, and an outer edge of the intermediate layer 23 coincide with each other. The substrate 11 has an outer edge portion 11c positioned on an outer side of the outer edge of the intermediate layer 23 with respect to the center of the gap S. For example, the outer edge portion 11c has a frame shape and surrounds the intermediate layer 23 in a case of being seen in a direction perpendicular to the first surface 11a.

In the Fabry-Perot interference filter 1, light having a predetermined wavelength is transmitted through a light transmission region 1a defined in a center portion thereof. For example, the light transmission region 1a is a columnar region. For example, the substrate 11 is made of silicon, quartz, or glass. When the substrate 11 is made of silicon, the reflection prevention layer 21 and the intermediate layer 23 are made of silicon oxide, for example. The thickness of the intermediate layer 23 ranges from several tens of nm to several tens of for example.

A part corresponding to the light transmission region 1a in the first laminate 22 functions as a first mirror portion 31. The first mirror portion 31 is disposed on the first surface 11a with the reflection prevention layer 21 interposed therebetween. The first laminate 22 is configured to have a plurality of polysilicon layers 25 and a plurality of silicon nitride layers 26 which are alternately laminated one by one. In the present embodiment, a polysilicon layer 25a, a silicon nitride layer 26a, a polysilicon layer 25b, a silicon nitride layer 26b, and a polysilicon layer 25c are laminated on the reflection prevention layer 21 in this order. The optical thickness of each of the polysilicon layer 25 and the silicon nitride layer 26 configuring the first mirror portion 31 is preferably an integral multiple of ¼ of a center transmission wavelength. The first mirror portion 31 may be directly disposed on the first surface 11a without the reflection prevention layer 21 interposed therebetween.

A part corresponding to the light transmission region 1a in the second laminate 24 functions as a second mirror portion 32. The second mirror portion 32 faces the first mirror portion 31 with the gap S interposed therebetween on a side opposite to the substrate 11 with respect to the first mirror portion 31. The second laminate 24 is disposed on the first surface 11a with the reflection prevention layer 21, the first laminate 22, and the intermediate layer 23 interposed therebetween. The second laminate 24 is configured to include a plurality of polysilicon layers 27 and a plurality of silicon nitride layers 28 which are alternately laminated one by one. In the present embodiment, a polysilicon layer 27a, a silicon nitride layer 28a, a polysilicon layer 27b, a silicon nitride layer 28b, and a polysilicon layer 27c are laminated on the intermediate layer 23 in this order. The optical thickness of each of the polysilicon layer 27 and the silicon nitride layer 28 configuring the second mirror portion 32 is preferably an integral multiple of ¼ of the center transmission wavelength.

In the first laminate 22 and the second laminate 24, silicon oxide layers may be used in place of the silicon nitride layers. In addition, as the material of each layer configuring the first laminate 22 and the second laminate 24, titanium oxide, tantalum oxide, zirconium oxide, magnesium fluoride, aluminum oxide, calcium fluoride, silicon, germanium, zinc sulfide, or the like may be used.

In a part corresponding to the gap S in the second laminate 24, a plurality of through-holes 24b leading from a surface 24a of the second laminate 24 on a side opposite to the intermediate layer 23 to the gap S are formed. The plurality of through-holes 24b are formed so as not to substantially affect the function of the second mirror portion 32. The plurality of through-holes 24b are used for forming the gap S by removing a part of the intermediate layer 23 through etching.

In addition to the second mirror portion 32, the second laminate 24 further has a covering portion 33 and a peripheral edge portion 34. The second mirror portion 32, the covering portion 33, and the peripheral edge portion 34 are integrally formed to have a part of the same laminated structure as each other and to be connected to each other. The covering portion 33 surrounds the second mirror portion 32 in a case of being seen in a direction perpendicular to the first surface 11a. The covering portion 33 covers a surface 23a of the intermediate layer 23 on a side opposite to the substrate 11, a side surface 23b of the intermediate layer 23 (a side surface on the outer side, that is, a side surface on a side opposite to the gap S side), a side surface 22a of the first laminate 22, and a side surface 21a of the reflection prevention layer 21 and leads to the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 in a case of being seen in a direction perpendicular to the first surface 11a. The peripheral edge portion 34 is positioned on the first surface 11a in the outer edge portion 11e. An outer edge of the peripheral edge portion 34 coincides with the outer edge of the substrate 11 in a case of being seen in a direction perpendicular to the first surface 11a.

The peripheral edge portion 34 is thinned along an outer edge of the outer edge portion 11c. That is, a part along the outer edge of the outer edge portion 11e in the peripheral edge portion 34 is thinned compared to other parts excluding the part along the outer edge in the peripheral edge portion 34. In the present embodiment, the peripheral edge portion 34 is thinned by removing a part of the polysilicon layer 27 and the silicon nitride layer 28 configuring the second laminate 24. The peripheral edge portion 34 has a non-thinned portion 34a connected to the covering portion 33, and a thinned portion 34b surrounding the non-thinned portion 34a. In the thinned portion 34b, the polysilicon layer 27 and the silicon nitride layer 28 excluding the polysilicon layer 27a directly provided on the first surface 11a are removed.

The height of a surface 34c of the non-thinned portion 34a on a side opposite to the substrate 11 from the first surface 11a is lower than the height of the surface 23a of the intermediate layer 23 from the first surface 11a. The height of the surface 34c of the non-thinned portion 34a from the first surface 11a ranges from 100 nm to 5,000 nm, for example. The height of the surface 23a of the intermediate layer 23 from the first surface 11a is a height greater than the height of the surface 34c of the non-thinned portion 34a from the first surface 11a within a range from 500 nm to 20,000 nm, for example. The width of the thinned portion 34b (distance between an outer edge of the non-thinned portion 34a and the outer edge of the outer edge portion 11c) is equal to or greater than 0.01 times the thickness of the substrate 11. The width of the thinned portion 34b ranges from 5 μm to 400 μm, for example. The thickness of the substrate 11 ranges from 500 μm to 800 μm, for example.

A first electrode 12 is formed in the first mirror portion 31 such that the light transmission region 1a is surrounded. The first electrode 12 is formed by doping impurities into the polysilicon layer 25c and decreasing resistance. A second electrode 13 is formed in the first mirror portion 31 such that the light transmission region 1a is included. The second electrode 13 is formed by doping impurities into the polysilicon layer 25c and decreasing resistance. The size of the second electrode 13 is preferably a size for including the entirety of the light transmission region 1a. However, the size may be approximately the same as the size of the light transmission region 1a.

A third electrode 14 is formed in the second mirror portion 32. The third electrode 14 faces the first electrode 12 and the second electrode 13 with the gap S interposed therebetween. The third electrode 14 is formed by doping impurities into the polysilicon layer 27a and decreasing resistance.

A pair of terminals 15 is provided to face each other while having the light transmission region 1a therebetween. Each of the terminals 15 is disposed inside a through-hole leading from the surface 24a of the second laminate 24 to the first laminate 22. Each of the terminals 15 is electrically connected to the first electrode 12 via a wiring 12a. For example, the terminals 15 are formed from a metal film made of aluminum or an alloy thereof.

A pair of terminals 16 is provided to face each other while having the light transmission region 1a therebetween. Each of the terminals 16 is disposed inside a through-hole leading from the surface 24a of the second laminate 24 to the first laminate 22. Each of the terminals 16 is electrically connected to the second electrode 13 via a wiring 13a and is electrically connected to the third electrode 14 via a wiring 14a. For example, the terminals 16 are formed from a metal film made of aluminum or an alloy thereof. The facing direction of the pair of terminals 15 and the facing direction of the pair of terminals 16 are orthogonal to each other (refer to FIG. 1).

Trenches 17 and 18 are provided on a surface 22b of the first laminate 22. The trench 17 annularly extends to surround a connection part with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13). Each of the regions within the trenches 17 and 18 may be an insulating material or a gap.

A trench 19 is provided on the surface 24a of the second laminate 24. The trench 19 annularly extends to surround the terminals 15. The trench 19 electrically insulates the terminals 15 and the third electrode 14. The region inside the trench 19 may be an insulating material or a gap.

A reflection prevention layer 41, a third laminate (third layer) 42, an intermediate layer (third layer) 43, and a fourth laminate (third layer) 44 are laminated on the second surface 11b of the substrate 11 in this order. The reflection prevention layer 41 and the intermediate layer 43 each have a configuration similar to that of the reflection prevention layer 21 and the intermediate layer 23. The third laminate 42 and the fourth laminate 44 each have a laminated structure symmetrical to that of the first laminate 22 and the second laminate 24 based on the substrate 11. The reflection prevention layer 41, the third laminate 42, the intermediate layer 43, and the fourth laminate 44 have a function of preventing warping of the substrate 11.

The third laminate 42, the intermediate layer 43, and the fourth laminate 44 are thinned along the outer edge of the outer edge portion 11c. That is, the part along the outer edge of the outer edge portion 11e in the third laminate 42, the intermediate layer 43, and the fourth laminate 44 is thinned compared to other parts excluding the part along the outer edge in the third laminate 42, the intermediate layer 43, and the fourth laminate 44. In the present embodiment, the third laminate 42, the intermediate layer 43, and the fourth laminate 44 are thinned by removing the entirety of the third laminate 42, the intermediate layer 43, and the fourth laminate 44 in a part overlapping the thinned portion 34b in a case of being seen in a direction perpendicular to the first surface 11a.

An opening 40a is provided in the third laminate 42, the intermediate layer 43, and the fourth laminate 44 such that the light transmission region 1a is included. The opening 40a has a diameter approximately the same as the size of the light transmission region 1a. The opening 40a is open on a light emission side, and the bottom surface of the opening 40a leads to the reflection prevention layer 41.

A light shielding layer 45 is formed on a surface of the fourth laminate 44 on the light emission side. For example, the light shielding layer 45 is made of aluminum. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is made of aluminum oxide. Optical influence due to the protective layer 46 can be disregarded by causing the thickness of the protective layer 46 to range from 1 to 100 nm (preferably, approximately 30 nm).

In the Fabry-Perot interference filter 1 configured as described above, if a voltage is applied to a location between the first electrode 12 and the third electrode 14 via the terminals 15 and 16, an electrostatic force corresponding to the voltage is generated between the first electrode 12 and the third electrode 14. The second mirror portion 32 is attracted to the first mirror portion 31 side fixed to the substrate 11 due to the electrostatic force, and the distance between the first mirror portion 31 and the second mirror portion 32 is adjusted. In this way, in the Fabry-Perot interference filter 1, the distance between the first mirror portion 31 and the second mirror portion 32 is changeable.

The wavelength of light transmitted through the Fabry-Perot interference filter 1 depends on the distance between the first mirror portion 31 and the second mirror portion 32 in the light transmission region 1a. Therefore, the wavelength of transmitting light can be suitably selected by adjusting the voltage to be applied to a location between the first electrode 12 and the third electrode 14. At this time, the second electrode 13 has the same potential as the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while the voltage to be applied to the Fabry-Perot interference filter 1 is changed (that is, while the distance between the first mirror portion 31 and the second mirror portion 32 is changed in the Fabry-Perot interference filter 1).

As described above, in the Fabry-Perot interference filter 1, in addition to the second mirror portion 32, the second laminate 24 further includes the covering portion 33 covering the intermediate layer 23, and the peripheral edge portion 34 positioned on the first surface 11a in the outer edge portion 11c. The second mirror portion 32, the covering portion 33, and the peripheral edge portion 34 are integrally formed in a manner of being connected to each other. Accordingly, the intermediate layer 23 is covered with the second laminate 24, so that peeling off of the intermediate layer 23 is prevented. In addition, since the intermediate layer 23 is covered with the second laminate 24, even when the gap S is formed in the intermediate layer 23 through etching, for example, deterioration of the intermediate layer 23 is prevented. As a result, stability of the intermediate layer 23 is improved. Moreover, in the Fabry-Perot interference filter 1, the peripheral edge portion 34 is thinned along the outer edge of the outer edge portion 11c. Accordingly, for example, even when a wafer including a part corresponding to the substrate 11 is cut along the outer edge of the outer edge portion 11c and the Fabry-Perot interference filter 1 is obtained, deterioration of each layer on the substrate 11 is prevented. As a result, stability of each layer on a substrate is improved. As described above, according to the Fabry-Perot interference filter 1, it is possible to prevent peeling caused in each layer on the substrate 11. Moreover, in the Fabry-Perot interference filter 1, since the side surface 23b of the intermediate layer 23 is covered with the second laminate 24, light entering from the side surface 23b of the intermediate layer 23 can be prevented, so that it is possible to prevent generation of stray light.

In addition, in the Fabry-Perot interference filter 1, the covering portion 33 covers the outer edge of the first laminate 22. Accordingly, it is possible to more reliably prevent peeling of the first laminate 22. Moreover, for example, even when a wafer including a part corresponding to the substrate 11 is cut along the outer edge of the outer edge portion 11c and the Fabry-Perot interference filter 1 is obtained, it is possible to more favorably prevent deterioration of the first laminate 22.

In addition, in the Fabry-Perot interference filter 1, an outer edge of the silicon nitride layer 26 included in the first laminate 22 is covered with the covering portion 33. Accordingly, the silicon nitride layer 26 of the first laminate 22 is not exposed to the outside. Therefore, for example, even when the gap S is formed in the intermediate layer 23 through etching using hydrofluoric acid gas, it is possible to prevent a residue from being generated due to reaction between the hydrofluoric acid gas and the silicon nitride layer 26.

In addition, in the Fabry-Perot interference filter 1, since a part of the polysilicon layer 27 and the silicon nitride layer 28 configuring the second laminate 24 is removed, the Fabry-Perot interference filter 1 is thinned along the outer edge of the outer edge portion 11c. Accordingly, the first surface 11a of the substrate 11 can be protected by the part remaining without being removed in the polysilicon layer 27 and the silicon nitride layer 28 configuring the second laminate 24. Moreover, in the Fabry-Perot interference filter 1, only the polysilicon layer 27a remains in the thinned portion 34b. Accordingly, the surface of the thinned portion 34b becomes smooth. Therefore, for example, even when a laser light is converged within a wafer along the outer edge of the outer edge portion 11c in order to cut the wafer including a part corresponding to the substrate 11 along the outer edge of the outer edge portion 11c, the laser light can be favorably converged within the wafer and the wafer can be precisely cut, so that it is possible to more favorably prevent deterioration of each layer on the substrate 11.

In addition, in the Fabry-Perot interference filter 1, the third laminate 42 and the fourth laminate 44 are disposed on the second surface 11b of the substrate 11, and the third laminate 42 and the fourth laminate 44 are thinned along the outer edge of the outer edge portion 11c. Accordingly, it is possible to prevent warping of the substrate 11 caused by discordance of the layer configuration between the first surface 11a side and the second surface 11b side of the substrate 11. Moreover, for example, even when a wafer including a part corresponding to the substrate 11 is cut along the outer edge of the outer edge portion 11c and the Fabry-Perot interference filter 1 is obtained, deterioration of the third laminate 42 and the fourth laminate 44 is prevented. As a result, stability of each layer on the substrate 11 is improved.

Method of Manufacturing Fabry-Perot Interference Filter

Figure 4:
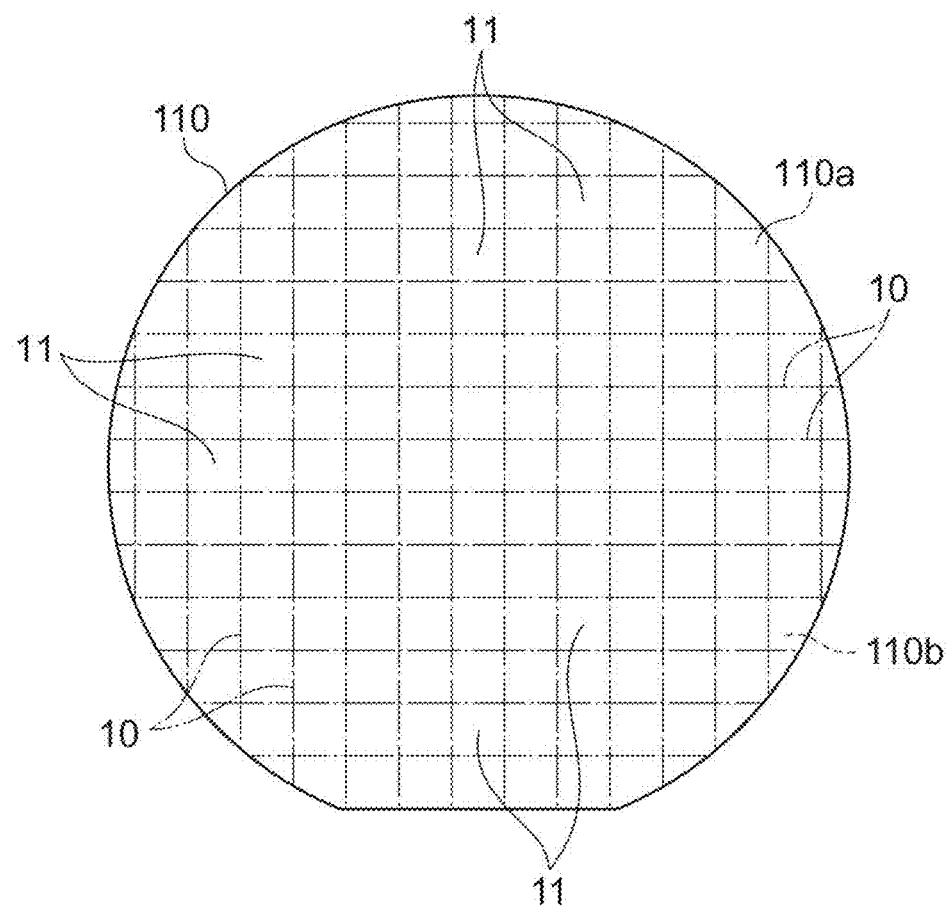
FIG. 4 is a plan view of a wafer used in a method of manufacturing the Fabry-Perot interference filter in FIG. 1.
Figure 5:
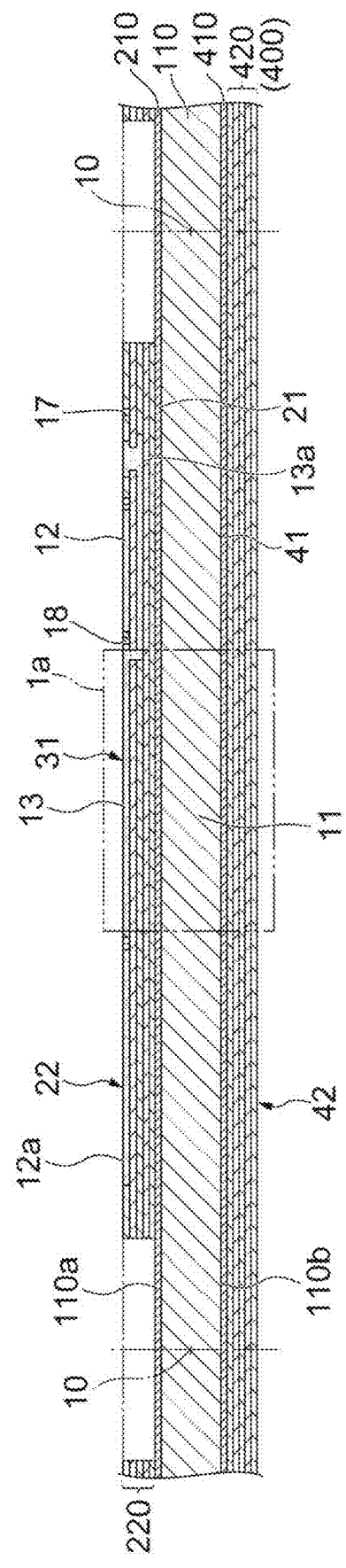
FIGS. 5(a) and 5(b) are cross-sectional views for describing the method of manufacturing the Fabry-Perot interference filter in FIG. 1.
Figure 5:
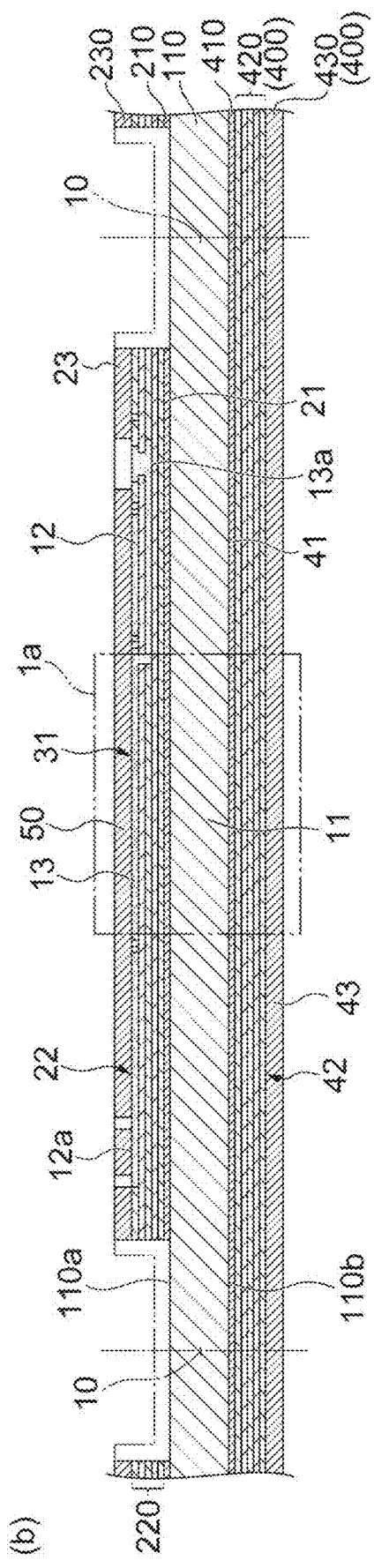
Figure 6:
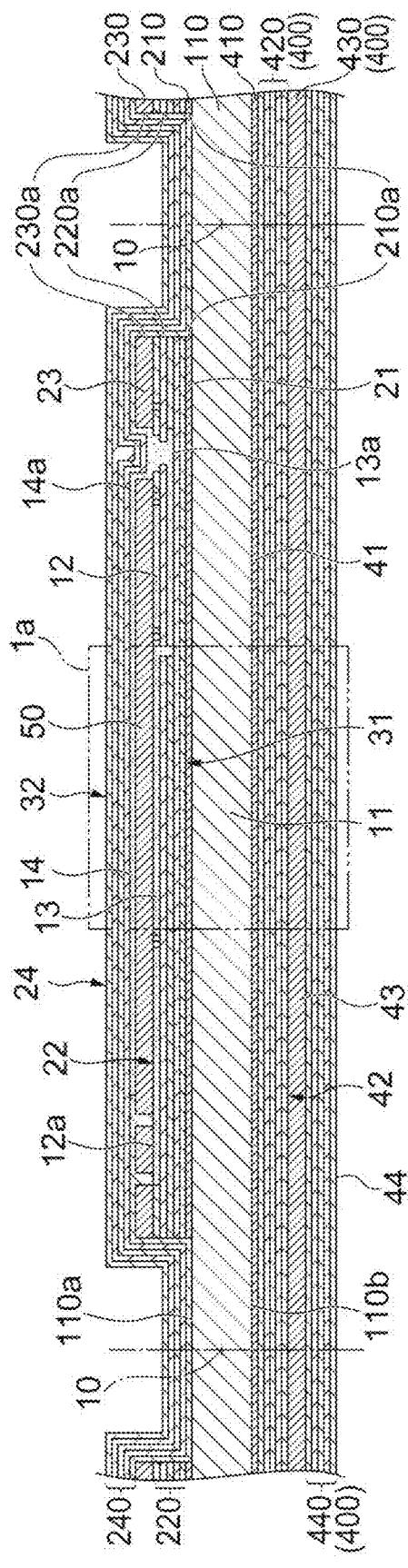
FIGS. 6(a) and 6(b) are cross-sectional views for describing the method of manufacturing the Fabry-Perot interference filter in FIG. 1.
Figure 7:
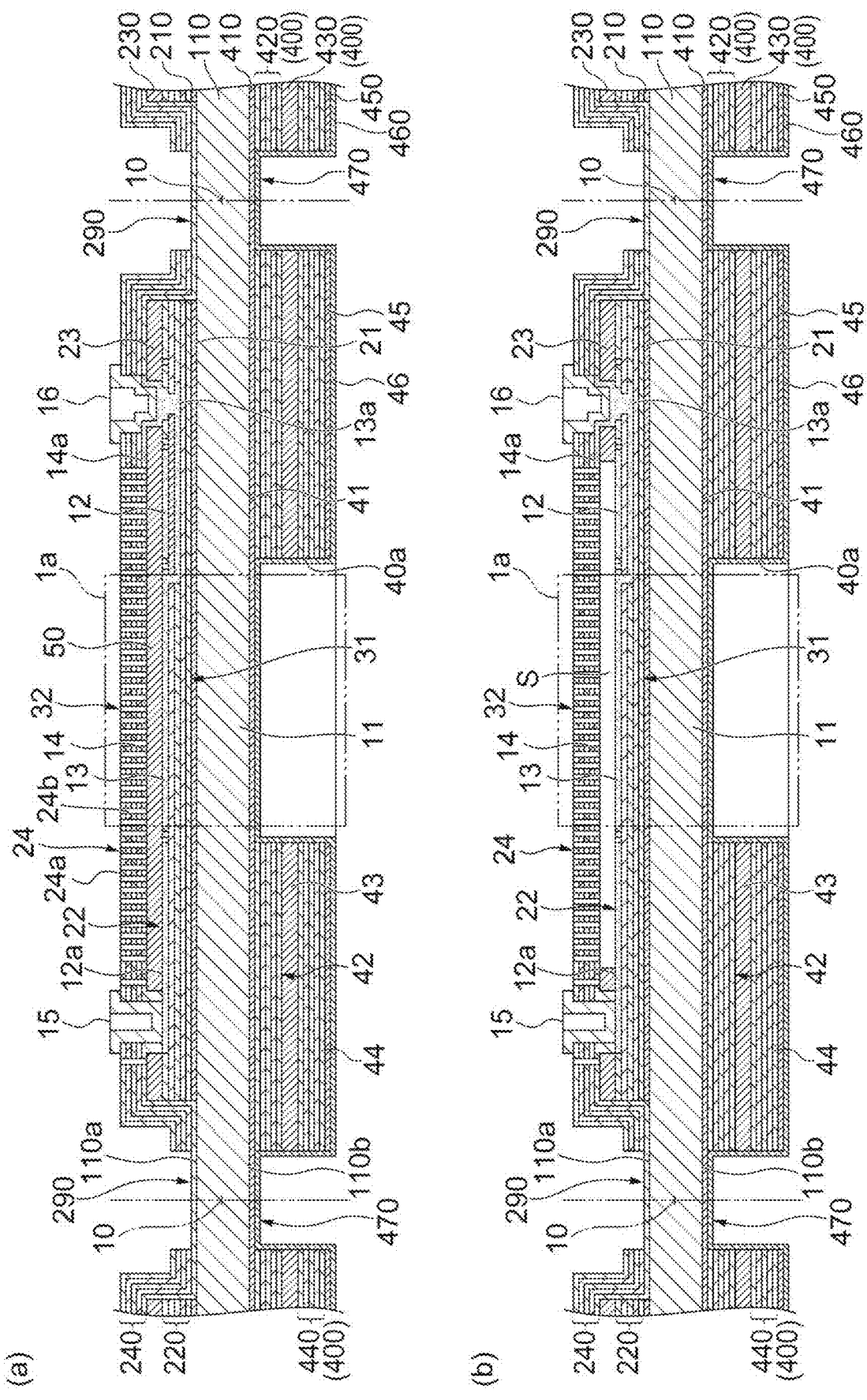
FIGS. 7(a) and 7(b) are cross-sectional views for describing the method of manufacturing the Fabry-Perot interference filter in FIG. 1.

First, as illustrated in FIG. 4, a wafer 110 is prepared. The wafer 110 is a wafer including parts corresponding to a plurality of substrates 11 arranged in a two-dimensional state and being expected to be cut into the plurality of substrates 11 along each of a plurality of lines 10. The wafer 110 has a first main surface 110a and a second main surface 110b facing each other. For example, the wafer 110 is made of silicon, quartz, or glass. As an example, when each of the substrates 11 exhibits a rectangular shape in a case of being seen in a direction perpendicular to the first main surface 110a, the plurality of substrates 11 are arranged in a two-dimensional matrix state, and the plurality of lines 10 are set in a lattice state to pass through a location between the substrates 11 adjacent to each other.

Subsequently, as illustrated in FIGS. 5(a) to 7(a), a forming step is carried out. In the forming step, a reflection prevention layer 210, a first mirror layer 220, a sacrificial layer 230, a second mirror layer 240, and a first thinned region 290 are formed on the first main surface 110a of the wafer 110 (refer to FIG. 7(a)). In addition, in the forming step, a stress adjustment layer 400, a light shielding layer 450, a protective layer 460, and a second thinned region 470 are formed on the second main surface 110b of the wafer 110 (refer to FIG. 7(a)).

Specifically, as illustrated in FIG. 5(a), the reflection prevention layer 210 is formed on the first main surface 110a of the wafer 110, and a reflection prevention layer 410 is formed on the second main surface 110b of the wafer 110. The reflection prevention layer 210 is a layer expected to be cut into a plurality of reflection prevention layers 21 along each of the lines 10. The reflection prevention layer 410 is a layer expected to be cut into a plurality of reflection prevention layers 41 along each of the lines 10.

Subsequently, a plurality of polysilicon layers and a plurality of silicon nitride layers are alternately laminated on each of the reflection prevention layers 210 and 410, so that the first mirror layer 220 is formed on the reflection prevention layer 210 and a layer 420 configuring the stress adjustment layer 400 is formed on the reflection prevention layer 410. The first mirror layer 220 is a layer having a plurality of first mirror portions 31 each of which is expected to function as a fixed mirror and is a layer expected to be cut into a plurality of first laminates 22 along each of the lines 10. The layer 420 configuring the stress adjustment layer 400 is a layer expected to be cut into a plurality of third laminates 42 along each of the lines 10.

When the first mirror layer 220 is formed, a part along each of the lines 10 in the first mirror layer 220 is removed through etching, such that the surface of the reflection prevention layer 210 is exposed. In addition, a predetermined polysilicon layer in the first mirror layer 220 is partially decreased in resistance by doping impurities, so that the first electrode 12, the second electrode 13, and the wirings 12a and 13a are formed in each part corresponding to the substrate 11. Moreover, the trenches 17 and 18 are formed on the surface of the first mirror layer 220 in each part corresponding to the substrate 11 through etching.

Subsequently, as illustrated in FIG. 5(b), the sacrificial layer 230 is formed on the first mirror layer 220 and the exposed surface of the reflection prevention layer 210, and a layer 430 configuring the stress adjustment layer 400 is formed on the layer 420 configuring the stress adjustment layer 400. The sacrificial layer 230 is a layer having a plurality of portions 50 expected to be removed and is a layer expected to be cut into a plurality of intermediate layers 23 along each of the lines 10. The portion 50 expected to be removed is a part corresponding to the gap S (refer to FIG. 3). The layer 430 configuring the stress adjustment layer 400 is a layer expected to be cut into a plurality of intermediate layers 43 along each of the lines 10.

Subsequently, a part along each of the lines 10 in the sacrificial layer 230 and the reflection prevention layer 210 is removed through etching, such that the first main surface 110a of the wafer 110 is exposed. In addition, through the etching, in each part corresponding to the substrate 11, a gap is formed in a part corresponding to each of the terminals 15 and 16 (refer to FIG. 3) in the sacrificial layer 230.

Subsequently, as illustrated in FIG. 6(a), a plurality of polysilicon layers and a plurality of silicon nitride layers are alternately laminated on each of the first main surface 110a side and the second main surface 110b side of the wafer 110, so that the second mirror layer 240 is formed on the sacrificial layer 230 and the exposed first main surface 110a of the wafer 110, and a layer 440 configuring the stress adjustment layer 400 is formed on the layer 430 configuring the stress adjustment layer 400. The second mirror layer 240 is a layer having a plurality of second mirror portions 32 each of which is expected to function as a movable mirror and is a layer expected to be cut into a plurality of second laminates 24 along each of the lines 10. The layer 440 configuring the stress adjustment layer 400 is a layer expected to be cut into a plurality of fourth laminates 44 along each of the lines 10.

When the second mirror layer 240 is formed, side surfaces 230a of the sacrificial layer 230, side surfaces 220a of the first mirror layer 220, and side surface 210a of the reflection prevention layer 210, facing each other along the line 10 are covered with the second mirror layer 240. In addition, a predetermined polysilicon layer in the second mirror layer 240 is partially decreased in resistance by doping impurities, so that the third electrode 14 and the wiring 14a are formed in each part corresponding to the substrate 11.

Subsequently, as illustrated in FIG. 6(b), through etching, a part along each of the lines 10 in the second mirror layer 240 is thinned, such that the surface of the polysilicon layer 27a configuring the second mirror layer 240 (refer to FIG. 3) (that is, the polysilicon layer positioned closest to the first main surface 110a side) is exposed (more specifically, such that the surface of the polysilicon layer 27a is exposed in a case of being seen in a direction perpendicular to the first main surface 110a). In addition, through the etching, in each part corresponding to the substrate 11, a gap is formed in a part corresponding to each of the terminals 15 and 16 (refer to FIG. 3) in the second mirror layer 240. Subsequently, in each part corresponding to the substrate 11, the terminals 15 and 16 are formed in the gap, the terminal 15 and the wiring 12a are connected to each other, and the terminal 16 and each of the wiring 13a and the wiring 14a are connected to each other.

Up to this point, the reflection prevention layer 210, the first mirror layer 220, the sacrificial layer 230, the second mirror layer 240, and the first thinned region 290 are formed on the first main surface 110a of the wafer 110. The first thinned region 290 is a region in which the first mirror layer 220, the sacrificial layer 230, and the second mirror layer 240 are partially thinned along each of the lines 10. The reflection prevention layer 210, the first mirror layer 220, the sacrificial layer 230, and the second mirror layer 240 are formed such that one reflection prevention layer 21, one first mirror portion 31, one portion 50 expected to be removed, and one second mirror portion 32 are disposed from one substrate 11 side in this order (that is, in order of one reflection prevention layer 21, one first mirror portion 31, one portion 50 expected to be removed, and one second mirror portion 32).

Subsequently, as illustrated in FIG. 7(a), in each part corresponding to the substrate 11, the plurality of through-holes 24b leading from the surface 24a of the second laminate 24 to the portion 50 expected to be removed are formed in the second laminate 24 through etching. Subsequently, the light shielding layer 450 is formed on the layer 440 configuring the stress adjustment layer 400. The light shielding layer 450 is a layer expected to be cut into a plurality of light shielding layers 45 along each of the lines 10. Subsequently, a part along each of the lines 10 in the light shielding layer 450 and the stress adjustment layer 400 (that is, the layers 420, 430, and 440) is removed through etching, such that the surface of the reflection prevention layer 410 is exposed. In addition, the opening 40a is formed in each part corresponding to the substrate 11 through the etching. Subsequently, the protective layer 460 is formed on the light shielding layer 450, the exposed surface of the reflection prevention layer 410, an inner surface of the opening 40a, and the side surface of the stress adjustment layer 400 facing the second thinned region 470. The protective layer 460 is a layer expected to be cut into a plurality of protective layers 46 along each of the lines 10.

Up to this point, the stress adjustment layer 400, the light shielding layer 450, the protective layer 460, and the second thinned region 470 are formed on the second main surface 110b of the wafer 110. The second thinned region 470 is a region in which the stress adjustment layer 400 is partially thinned along each of the lines 10.

Subsequent to the forming step described above, as illustrated in FIG. 7(b), a removing step is carried out. Specifically, the plurality of portions 50 expected to be removed are removed all at the same time from the sacrificial layer 230 through etching (for example, gas phase etching using hydrofluoric acid gas) through the plurality of through-holes 24b. Accordingly, the gap S is formed in each part corresponding to the substrate 11.

Figure 8:
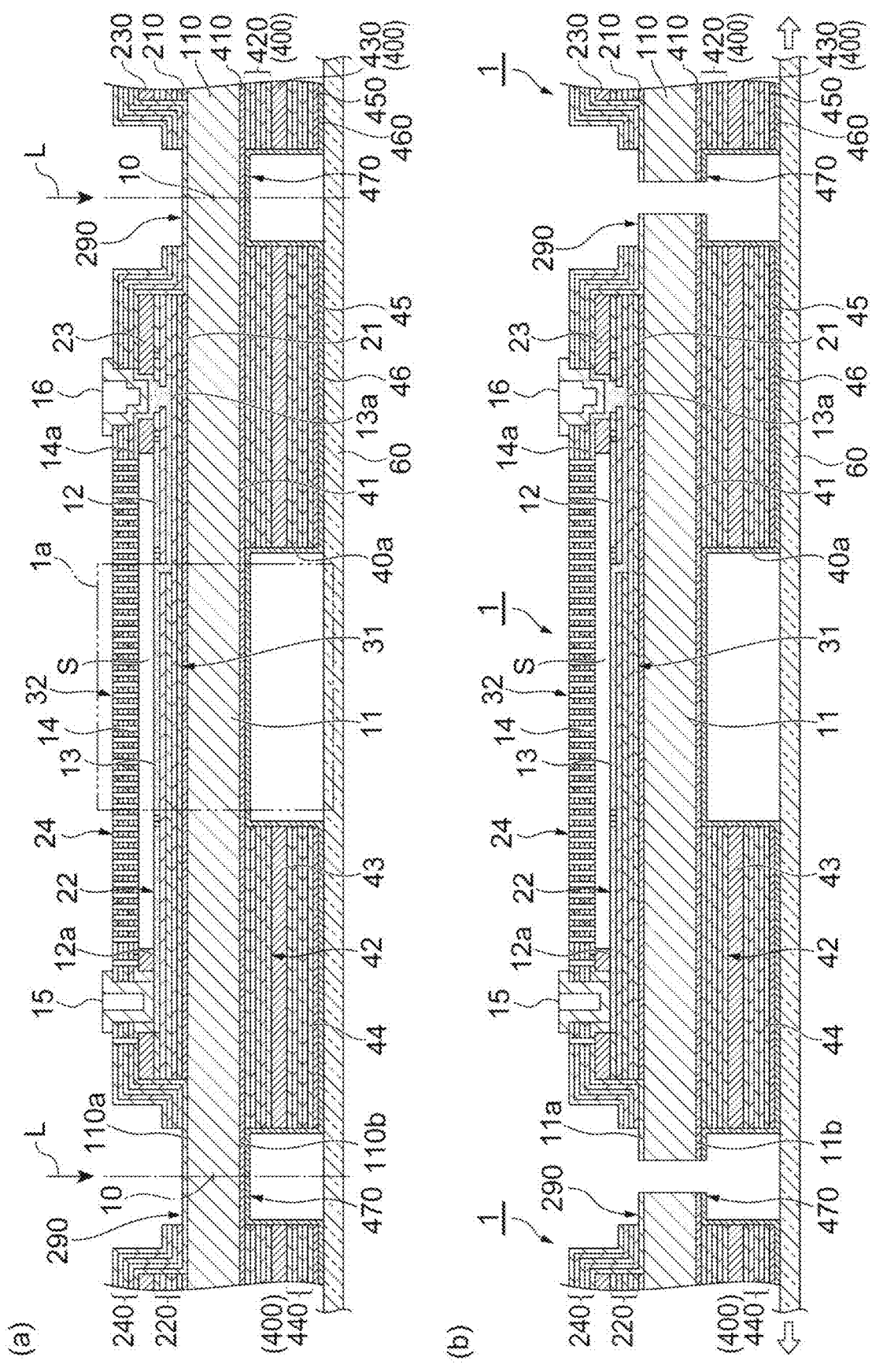
FIGS. 8(a) and 8(b) are cross-sectional views for describing the method of manufacturing the Fabry-Perot interference filter in FIG. 1.

Subsequently, as illustrated in FIGS. 8(a) and 8(b), a cutting step is carried out. Specifically, as illustrated in FIG. 8(a), an expanding tape 60 is attached onto the protective layer 460 (that is, to the stress adjustment layer 400 side). Subsequently, in a state in which the expanding tape 60 is attached to the stress adjustment layer 400 side, irradiation of a laser light L is performed from a side opposite to the expanding tape 60, and a converging point of the laser light L is relatively moved along each of the lines 10 while the converging point of the laser light L is positioned within the wafer 110. That is, the laser light L is incident on the wafer 110 from a side opposite to the expanding tape 60 through the surface of the polysilicon layer exposed in the first thinned region 290.

Then, a modified region is formed within the wafer 110 along each of the lines 10 through the irradiation of the laser light L. The modified region indicates a region in which a density, a refractive index, mechanical strength, and other physical characteristics have attained states different from those on the surroundings and indicates a region which becomes a start point of a crack extended in a thickness direction of the wafer 110. Examples of the modified region include molten processed regions (which means at least any one of a region resolidified after melting, a region in a melted state, and a region in the state of being resolidified from the melted state), a crack region, a dielectric breakdown region, a refractive index changed region, and a mixed region thereof. Further, there are a region where the density of the modified region has changed from that of an unmodified region and a region formed with a lattice defect in a material of the wafer 110 as the modified region. When the material of the wafer 110 is monocrystalline silicon, the modified region can also be referred to as a high dislocation density region. The number of rows of the modified regions arranged in the thickness direction of the wafer 110 with respect to each of the lines 10 is appropriately adjusted based on the thickness of the wafer 110.

Subsequently, as illustrated in FIG. 8(b), the expanding tape 60 attached to the stress adjustment layer 400 side is expanded, so that a crack is extended in the thickness direction of the wafer 110 from the modified region formed within the wafer 110, and the wafer 110 is then cut into the plurality of substrates 11 along each of the lines 10. At this time, the polysilicon layer of the second mirror layer 240 is cut along each of the lines 10 in the first thinned region 290, and the reflection prevention layer 410 and the protective layer 460 are cut along each of the lines 10 in the second thinned region 470. Accordingly, a plurality of Fabry-Perot interference filters 1 in a state of being separated from each other on the expanding tape 60 are obtained.

As described above, in a method of manufacturing the Fabry-Perot interference filter 1, after forming the first thinned region 290 in which at least one of the first mirror layer 220, the sacrificial layer 230, and the second mirror layer 240 is partially thinned along each of the lines 10, the modified region is formed within the wafer 110 along each of the lines 10 through irradiation of the laser light L. Accordingly, scattering or the like of the laser light L is prevented so that the modified region can be reliably formed within the wafer 110. Moreover, since at least one of the first mirror layer 220, the sacrificial layer 230, and the second mirror layer 240 is partially thinned along each of the lines 10, it is possible to prevent damage from being caused in the first mirror layer 220, the sacrificial layer 230, and the second mirror layer 240 when the wafer 110 is cut into the plurality of substrates 11 along each of the lines 10 (if the first thinned region 290 is not formed, an impact, stress, or the like is transferred to the first mirror layer 220, the sacrificial layer 230, and the second mirror layer 240 so that damage is likely to be caused when the wafer 110 is cut into the plurality of substrates 11 along each of the lines 10). Thus, according to the method of manufacturing the Fabry-Perot interference filter 1, both manufacturing efficiency and a yield can be improved, and the Fabry-Perot interference filter 1 with high quality can be stably mass-produced.

In addition, in the method of manufacturing the Fabry-Perot interference filter 1, in the forming step, the stress adjustment layer 400 is formed on the second main surface 110b of the wafer 110, and the second thinned region 470 in which the stress adjustment layer 400 is partially thinned along each of the lines 10 is formed. Accordingly, it is possible to prevent warping of the wafer 110 caused by discordance of the layer configuration between the first main surface 110a side and the second main surface 110b side. Moreover, since the stress adjustment layer 400 is partially thinned along each of the lines 10, it is possible to prevent damage from being caused in the stress adjustment layer 400 such as a part on the periphery of the opening 40a when the wafer 110 is cut into the plurality of substrates 11 along each of the lines 10, (if the second thinned region 470 is not formed, an impact, stress, or the like is transferred to the stress adjustment layer 400 such as a part on the periphery of the opening 40a so that damage is likely to be caused when the wafer 110 is cut into the plurality of substrates 11 along each of the lines 10).

Particularly, in the Fabry-Perot interference filter 1, since the first mirror layer 220, the sacrificial layer 230, and the second mirror layer 240 formed on the first main surface 110a of the wafer 110, and the stress adjustment layer 400 formed on the second main surface 110b of the wafer 110 are thin and elaborate layer structures, if the first thinned region 290 and the second thinned region 470 are not formed before the cutting step is carried out, damage is likely to be caused in the layer structure in the cutting step. This becomes noticeable because a force acts such that the layer structure is torn off when carrying out the cutting step in which the crack is extended from the modified region by expanding the expanding tape 60. In the method of manufacturing the Fabry-Perot interference filter 1, the first thinned region 290 and the second thinned region 470 are formed before the cutting step is carried out, so that it is possible to carry out laser processing with less contamination during a dry process (internal processing-type laser processing for forming a modified region within the wafer 110) while damage is prevented from being caused in the layer structure.

The above description is based on the following knowledge found out by the inventor, such as "although each of the first mirror layer 220, the sacrificial layer 230, the second mirror layer 240, and the stress adjustment layer 400 has a thin layer structure, it is difficult to stably form a modified region leading to the within of the layers thereof through irradiation of the laser light L" and "in contrast, since each of the first mirror layer 220, the sacrificial layer 230, the second mirror layer 240, and the stress adjustment layer 400 has a thin layer structure, the layers are likely to be torn off and be greatly damaged unless the first thinned region 290 and the second thinned region 470 are formed".

In addition, in the method of manufacturing the Fabry-Perot interference filter 1, the forming step is carried out to form the first mirror layer 220, the sacrificial layer 230, the second mirror layer 240, and the first thinned region 290 on the first main surface 110a of the wafer 110 and to fault the stress adjustment layer 400 and the second thinned region 470 on the second main surface 110b of the wafer 110. Thereafter, the removing step is carried out to remove the portion 50 expected to be removed from the sacrificial layer 230. Accordingly, the removing step is carried out in a state in which internal stress of the wafer 110 is reduced. Therefore, it is possible to prevent a strain, deformation, or the like from being generated in the first mirror portion 31 and the second mirror portion 32 facing each other through the gap S. For example, if at least forming of the second thinned region 470 is carried out after the portion 50 expected to be removed is removed from the sacrificial layer 230, a strain, deformation, or the like is likely to be generated in the first mirror portion 31 and the second mirror portion 32 facing each other through the gap S, so that it is difficult to obtain the Fabry-Perot interference filter 1 having desired characteristics.

In addition, in the method of manufacturing the Fabry-Perot interference filter 1, in the cutting step, the crack is extended in the thickness direction of the wafer 110 from the modified region by expanding the expanding tape 60 attached to the stress adjustment layer 400 side. Accordingly, it is possible to prevent damage from being caused due to the attached expanding tape 60 in the second mirror layer 240 having the plurality of second mirror portions 32 each of which is expected to function as the movable mirror. Moreover, since an expanding force of the expanding tape 60 is likely to be concentrated in the modified region and a part in the vicinity thereof due to the presence of the second thinned region 470, the crack can be easily extended in the thickness direction of the wafer 110 from the modified region.

In addition, in the method of manufacturing the Fabry-Perot interference filter 1, in the cutting step, in a state in which the expanding tape 60 is attached to the stress adjustment layer 400 side, the laser light L is incident on the wafer 110 from a side opposite to the expanding tape 60. Accordingly, scattering, attenuation, or the like of the laser light L caused by the expanding tape 60 is prevented so that the modified region can be reliably formed within the wafer 110 along each of the lines 10.

In addition, in the method of manufacturing the Fabry-Perot interference filter 1, the removing step of removing the portion 50 expected to be removed from the sacrificial layer 230 through etching is carried out before the cutting step (that is, between the forming step and the cutting step) of cutting the wafer 110 into the plurality of substrates 11 along each of the lines 10. Accordingly, since the removing step of removing the portion 50 expected to be removed from the sacrificial layer 230 through etching is carried out at wafer 110 level, compared to a case in which the removing step is individually carried out at chip level, it is possible to form the gap S between the first mirror portion 31 and the second mirror portion 32 in a remarkably efficient way. At this time, although a part corresponding to the second mirror portion 32 in the second mirror layer 240 is in a state of floating in the gap S, the following cutting step is carried out through irradiation of the laser light L. Therefore, it is possible to effectively prevent a situation in which the second mirror portion 32 floating in the gap S is damaged.

In addition, in the method of manufacturing the Fabry-Perot interference filter 1, in the forming step, after a part along each of the lines 10 in the sacrificial layer 230 formed on the first mirror layer 220 is thinned, the side surfaces 230a of the sacrificial layer 230 facing each other along each of the lines 10 are covered with the second mirror layer 240 by forming the second mirror layer 240 on the sacrificial layer 230. Accordingly, it is possible to prevent a part of the side surfaces 230a of the sacrificial layer 230 from being removed (erosion) when the portion 50 expected to be removed is removed from the sacrificial layer 230 through etching. Moreover, in the manufactured Fabry-Perot interference filter 1, it is possible to prevent light which becomes stray light from being incident from the side surface 23b of the intermediate layer 23 corresponding to the side surface 230a of the sacrificial layer 230.

In addition, in the method of manufacturing the Fabry-Perot interference filter 1, in the forming step, a part along each of the lines 10 in at least one of the first mirror layer 220, the sacrificial layer 230, and the second mirror layer 240 is thinned such that the surface of the polysilicon layer configuring the second mirror layer 240 is exposed (more specifically, such that the surface of the polysilicon layer 27a is exposed in a case of being seen in a direction perpendicular to the first main surface 110a). In the cutting step, the laser light L is incident on the wafer 110 through the surface of the polysilicon layer included in the second mirror layer 240. Accordingly, the first main surface 110a of the wafer 110 is protected by the polysilicon layer of which the surface is exposed, and flatness of a surface, on which the laser light L is incident, is maintained. Therefore, scattering or the like of the laser light L is prevented so that the modified region can be more reliably formed within the wafer 110.

In the related art, generally, the removing step of removing the portion 50 expected to be removed from the sacrificial layer 230 through etching is carried out after the cutting step of cutting the wafer 110 into the plurality of substrates 11 along each of the lines 10. The reason is that, for example, if forming of the gap S in the sacrificial layer 230 is carried out before blade dicing, there is increasing concern that the second mirror portion 32 floating in the gap S is damaged when blade dicing is carried out. In addition, there is increasing concern that particles generated when blade dicing is carried out infiltrate into the gap S or cooling rinse water used in blade dicing infiltrates into the gap S.

Modification Example

Hereinabove, the embodiment of the present disclosure has been described. However, the method of manufacturing a Fabry-Perot interference filter of the present disclosure is not limited to the embodiment described above. For example, the material and the shape of each configuration are not limited to the material and the shape described above, and it is possible to employ various materials and shapes.

In addition, the order of forming each layer and each region in the forming step is not limited to that described above. As an example, the first thinned region 290 may be formed by forming the first mirror layer 220, the sacrificial layer 230, and the second mirror layer 240 on the first main surface 110a of the wafer 110, and then thinning a part along each of the lines 10 in the first mirror layer 220, the sacrificial layer 230, and the second mirror layer 240. In addition, the first thinned region 290 and the second thinned region 470 may be formed after forming the first mirror layer 220, the sacrificial layer 230, and the second mirror layer 240 on the first main surface 110a of the wafer 110, and forming the stress adjustment layer 400 on the second main surface 110b of the wafer 110.

In addition, the first thinned region 290 need only be a region in which at least one of the first mirror layer 220, the sacrificial layer 230, and the second mirror layer 240 is partially thinned along each of the lines 10. Therefore, the first thinned region 290 may be a region from which all of the parts along each of the lines 10 in all of the layers on the first main surface 110a side including the first mirror layer 220, the sacrificial layer 230, and the second mirror layer 240 are removed.

In addition, the second thinned region 470 need only be a region in which at least a part of the stress adjustment layer 400 is partially thinned along each of the lines 10. Therefore, the second thinned region 470 may be a region from which all of the parts along each of the lines 10 in all of the layers on the second main surface 110b side including the stress adjustment layer 400 are removed. In the forming step, the second thinned region 470 does not have to be formed. Moreover, the stress adjustment layer 400 itself does not have to be formed.

In addition, the removing step of removing the portion 50 expected to be removed from the sacrificial layer 230 through etching may be carried out after the cutting step of cutting the wafer 110 into the plurality of substrates 11 along each of the lines 10. In this case, in each part corresponding to the substrate 11, the portion 50 expected to be removed is removed from the sacrificial layer 230 through etching.

In addition, the cutting step may be carried out as illustrated in FIGS. 9(a) and 9(b). Specifically, as illustrated in FIG. 9(a), the expanding tape 60 is attached onto the protective layer 460 (that is, the stress adjustment layer 400 side). Subsequently, in a state in which the expanding tape 60 is attached to the stress adjustment layer 400 side, irradiation of the laser light L is performed from the expanding tape 60 side, and the converging point of the laser light L is relatively moved along each of the lines 10 while the converging point of the laser light L is positioned within the wafer 110. That is, the laser light L is incident on the wafer 110 from the expanding tape 60 side through the expanding tape 60. Then, the modified region is formed within the wafer 110 along each of the lines 10 through the irradiation of the laser light L.

Subsequently, as illustrated in FIG. 9(b), crack is extended in the thickness direction of the wafer 110 from the modified region formed within the wafer 110 by expanding the expanding tape 60 attached to the stress adjustment layer 400 side, and the wafer 110 is cut into the plurality of substrates 11 along each of the lines 10. Then, the plurality of Fabry-Perot interference filters 1 in a state of being separated from each other on the expanding tape 60 are obtained.

According to such a cutting step, as illustrated in FIG. 9(*a*), for example, even if generated particles fall due to their own weight when irradiation of the laser light L is performed from above, the expanding tape 60 functions as a cover. Therefore, it is possible to prevent such particles from adhering to the second mirror layer 240 or the like.

In addition, in the cutting step, when the modified region is formed within the wafer 110 along each of the lines 10 through irradiation of the laser light L, crack may be extended in the thickness direction of the wafer 110 from the modified region and the wafer 110 may be cut into the plurality of substrates 11 along each of the lines 10. In this case, the plurality of Fabry-Perot interference filters 1 obtained through cutting can be separated from each other by expanding the expanding tape 60.

In addition, in the forming step, at least one of the first mirror layer 220, the sacrificial layer 230, and the second mirror layer 240 may be partially thinned along each of the lines 10 such that the surface of the polysilicon layer configuring the first mirror layer 220 instead of the second mirror layer 240 is exposed, and in the cutting step, the laser light L may be incident on the wafer 110 through the surface of the polysilicon layer included in the first mirror layer 220 instead of the second mirror layer 240.

Moreover, the layer of which the surface is exposed in the forming step need only be at least one layer configuring the first mirror layer 220 or the second mirror layer 240. Specifically, the layer of which the surface is exposed in the forming step is not limited to a polysilicon layer and may be a silicon nitride layer or a silicon oxide layer, for example. In that case as well, the first main surface 110*a* of the wafer 110 is protected by the layer of which the surface is exposed, and flatness of a surface, on which the laser light L is incident, is maintained. Therefore, scattering or the like of the laser light L is prevented so that the modified region can be more reliably formed within the wafer 110. When forming a smooth surface, in order to partially thin at least one of the first mirror layer 220, the sacrificial layer 230, and the second mirror layer 240 along each of the lines 10, it is more advantageous to carry out wet etching than dry etching.

REFERENCE SIGNS LIST

1: Fabry-Perot interference filter, 10: line, 11: substrate, 31: first mirror portion, 32: second mirror portion, 50: portion expected to be removed, 60: expanding tape, 110: wafer, 110*a*: first main surface, 110*b*: second main surface, 220: first mirror layer, 230: sacrificial layer, 230*a*: side surface, 240: second mirror layer, 290: first thinned region, 400: stress adjustment layer, 470: second thinned region, L: laser light

The invention claimed is:

1. A method of manufacturing a Fabry-Perot interference filter comprising:
   a forming step of forming a first thinned region, in the forming step, a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror are formed on a first main surface of a wafer expected to be cut into a plurality of substrates along each of a plurality of lines such that one first mirror portion, one portion expected to be removed, and one second mirror portion are disposed in this order from one substrate side, and the first thinned region in which at least one of the first mirror layer, the sacrificial layer, and the second mirror layer is partially thinned along each of the plurality of lines is formed;
   a cutting step of cutting the wafer into the plurality of substrates along each of the plurality of lines by forming a modified region within the wafer along each of the plurality of lines through irradiation of a laser light and extending a crack in a thickness direction of the wafer from the modified region, after the forming step; and
   a removing step of removing the portion expected to be removed from the sacrificial layer through etching, between the forming step and the cutting step or after the cutting step,
   wherein in the forming step, a stress adjustment layer is formed on a second main surface of the wafer, and a second thinned region in which the stress adjustment layer is partially thinned along each of the plurality of lines is formed.

2. The method of manufacturing a Fabry-Perot interference filter according to claim 1,
   wherein in the cutting step, the crack is extended in the thickness direction of the wafer from the modified region by expanding an expanding tape attached to the stress adjustment layer side.

3. The method of manufacturing a Fabry-Perot interference filter according to claim 2,
   wherein in the cutting step, in a state in which the expanding tape is attached to the stress adjustment layer side, the laser light is incident on the wafer from a side opposite to the expanding tape.

4. The method of manufacturing a Fabry-Perot interference filter according to claim 2,
   wherein in the cutting step, in a state in which the expanding tape is attached to the stress adjustment layer side, the laser light is incident on the wafer through the expanding tape from the expanding tape side.

5. The method of manufacturing a Fabry-Perot interference filter according to claim 1,
   wherein the removing step is carried out between the forming step and the cutting step.

6. A method of manufacturing a Fabry-Perot interference filter comprising:
   a forming step of forming a first thinned region, in the forming step, a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror are formed on a first main surface of a wafer expected to be cut into a plurality of substrates along each of a plurality of lines such that one first mirror portion, one portion expected to be removed, and one second mirror portion are disposed in this order from one substrate side, and the first thinned region in which at least one of the first mirror layer, the sacrificial layer, and the second mirror layer is partially thinned along each of the plurality of lines is formed;
   a cutting step of cutting the wafer into the plurality of substrates along each of the plurality of lines by forming a modified region within the wafer along each of the plurality of lines through irradiation of a laser light and extending a crack in a thickness direction of the wafer from the modified region, after the forming step; and a removing step of removing the portion expected to be removed from the sacrificial layer through etching, between the forming step and the cutting step or after the cutting step, wherein in the forming step, after a part along each of the plurality of lines in the sacrificial layer formed on the first mirror layer is thinned, side surfaces of the sacrificial layer facing each other along each of the plurality of lines are covered with the second mirror layer by forming the second mirror layer on the sacrificial layer.

7. The method of manufacturing a Fabry-Perot interference filter according to claim 6, wherein the removing step is carried out between the forming step and the cutting step.

8. A method of manufacturing a Fabry-Perot interference filter comprising:

a forming step of forming a first thinned region, in the forming step a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror are formed on a first main surface of a wafer expected to be cut into a plurality of substrates along each of a plurality of lines such that one first mirror portion, one portion expected to be removed, and one second mirror portion are disposed in this order from one substrate side, and the first thinned region in which at least one of the first mirror layer, the sacrificial layer, and the second mirror layer is partially thinned along each of the plurality of lines is formed;

a cutting step of cutting the wafer into the plurality of substrates along each of the plurality of lines by forming a modified region within the wafer along each of the plurality of lines through irradiation of a laser light and extending a crack in a thickness direction of the wafer from the modified region, after the forming step; and a removing step of removing the portion expected to be removed from the sacrificial layer through etching, between the forming step and the cutting step or after the cutting step, wherein in the forming step, a part along each of the plurality of lines in at least one of the first mirror layer, the sacrificial layer, and the second mirror layer is thinned such that a surface of at least one layer configuring the first mirror layer or the second mirror layer is exposed, and wherein in the cutting step, the laser light is incident on the wafer through the surface of the layer.

9. The method of manufacturing a Fabry-Perot interference filter according to claim 8, wherein the removing step is carried out between the forming step and the cutting step.

* * * * *